US009461444B2

(12) United States Patent
Anderson

(10) Patent No.: US 9,461,444 B2

(45) Date of Patent: Oct. 4, 2016

(54) FAN COOLED IGNITION COIL METHOD AND APPARATUS

(71) Applicant: Cummins Inc.

(72) Inventor: Alan C. Anderson, Columbus, IN (US)

(73) Assignee: CUMMINS INC., Columbus, IN (US)

( * ) Notice: Subject to any disclaimer, the term of this patent is extended or adjusted under 35 U.S.C. 154(b) by 148 days.

(21) Appl. No.: 14/331,835

(22) Filed: Jul. 15, 2014

(65) Prior Publication Data

US 2016/0021783 A1 Jan. 21, 2016

(51) Int. Cl.
*H05K 7/20* (2006.01)
*H01T 15/00* (2006.01)

(52) U.S. Cl.
CPC .................................... *H01T 15/00* (2013.01)

(58) Field of Classification Search
CPC .................... H05K 7/20209; H05K 7/20272; H05K 7/20281; H05K 7/20863; H05K 7/20872; H01T 13/04; H01T 13/08; H01T 13/20; H01T 13/40; H01T 15/00; F01P 3/02; F01P 3/026; F01P 3/12; F01P 3/16; H01F 5/02; H01F 5/04; H01F 27/02; H01F 27/022; H01F 27/30; H01F 27/306; H01F 27/32; H01F 27/324; H01F 27/325; H01F 27/326; H01F 27/40; H01F 38/12; H01F 41/005; H01F 2005/022; H01F 2005/025; H01F 2017/048
USPC ............... 361/263; 123/41.31, 41.32, 143 C, 123/169 P, 169 R, 635; 336/96, 98, 107, 336/196, 198
See application file for complete search history.

(56) References Cited

U.S. PATENT DOCUMENTS

| | | | | |
|---|---|---|---|---|
| 4,134,370 | A | 1/1979 | Iwahashi et al. | |
| 4,494,490 | A | 1/1985 | Kiyooka et al. | |
| 5,588,401 | A | 12/1996 | Matsumoto et al. | |
| 5,870,012 | A * | 2/1999 | Sakamaki | H01T 13/44 123/621 |

* cited by examiner

*Primary Examiner* — Thienvu Tran
*Assistant Examiner* — Kevin J Comber
(74) *Attorney, Agent, or Firm* — Faegre Baker Daniels LLP

(57) ABSTRACT

This disclosure provides an ignition coil for a spark ignited internal combustion engine. The ignition coil includes a coil body having an outer surface and internal windings coupled to a connector. The ignition coil also includes a housing surrounding the coil body. The housing has an outer wall spaced apart from the outer surface of the coil body thereby forming a gap between the outer surface of the coil body and the outer wall. The outer wall includes an opening in flow communication with the gap.

26 Claims, 9 Drawing Sheets

900

| POWER (902) | COIL TEMP (904) | | PUMP SPEED (906) | PUMP (908) | ACTION (910) |
|---|---|---|---|---|---|
| ON | < SET | | ---- | OFF | ---- |
| ON | >= SET | | ---- | ON | ---- |
| ON | >= SET | < MAX | < SET | ON | SET FAULT |
| ON | >= SET | >= MAX | ANY | ON | CORRECTIVE ACTION |

FIGURE 9

FAN COOLED IGNITION COIL METHOD AND APPARATUS

TECHNICAL FIELD OF THE DISCLOSURE

This disclosure relates generally to an ignition system for spark-ignited internal combustion engines, and more particularly, to a system and method for cooling an ignition coil.

BACKGROUND OF THE DISCLOSURE

Ignition systems used in spark-ignited internal combustion engines are exposed to high temperatures. In particular, ignition coils are sometimes mounted to the engine's surface, exposing the ignition coil to increased operating temperatures due to heat transfer from the engine to the ignition coil.

In addition, high spark energy ignition systems have become more necessary in order for spark-ignited internal combustion engines to meet more stringent emission and fuel economy requirements. As spark energy increases, the resistive power loss in the ignition coil increases. This increase in power loss may result in increased coil temperatures.

To reduce the effects of these higher operating and environmental temperatures, ignition coil cooling is desirable to improve longevity and performance of the ignition coil.

SUMMARY OF THE DISCLOSURE

In one embodiment, the present disclosure provides an ignition coil for a spark ignited internal combustion engine which includes a coil body having an outer surface and internal windings coupled to a connector, a housing surrounding the coil body, wherein the housing has an outer wall spaced apart from the outer surface of the coil body thereby forming a gap between the outer surface of the coil body and the outer wall, and the outer wall includes an opening in flow communication with the gap. In one aspect of this embodiment, the ignition coil further includes a temperature sensor supported by the housing and coupled to the connector, the temperature sensor generating a temperature signal indicating a temperature of the coil body. In another aspect of this embodiment, the outer wall of the ignition coil includes a plurality of openings. In another aspect of this embodiment, the ignition coil includes a flange coupled to the housing, wherein the flange has a plurality of openings for receiving fasteners to couple the ignition coil to the engine. In another aspect of this embodiment, the housing of the ignition coil is formed of molded plastic. One variant of this aspect includes a fluid pump which, in operation, forces fluid from outside the housing into an opening, through the gap and out another opening to cool the coil body. In a variant to this variant, the pump is supported by the housing. In another variant, the ignition coil includes a speed sensor and coupled to the connector, the speed sensor generates a speed signal indicating speed of operation of the pump. In another variant, the pump of the ignition coil is a fan having a plurality of rotatable blades which, in operation, force air from outside the housing into an opening, through the gap and out another opening to cool the coil body. In another variant, the fan of the ignition coil is molded into the housing. In another variant, the ignition coil includes a first opening and second opening which are centered on a common axis which is perpendicular to a longitudinal axis of the coil body.

In another embodiment, the present disclosure provides a method of cooling a coil body of an ignition coil for a spark ignited internal combustion engine which includes providing a housing having an outer wall spaced apart from the coil body to form a gap between the coil body and the outer wall, wherein the outer wall has a plurality of openings in flow communication with the gap, providing a pump, comparing a sensed temperature of the coil body to a threshold temperature, and activating the pump when the sensed temperature is greater than the threshold temperature to force fluid from outside the housing into the opening, through the gap, and out an opening to cool the coil body. In one aspect of this embodiment, the method includes deactivating the pump when the sensed temperature is less than the threshold temperature. In another aspect of this embodiment, the pump is supported by a housing. In another aspect of this embodiment, the method includes comparing a sensed operation speed of the pump to a set point speed and generating a first fault signal when the pump is activated and the sensed operation speed is less than the set point speed. In a variant of this aspect, the method includes generating a second fault signal when the pump is activated, wherein the sensed operation speed is less than the set point, and the sensed temperature exceeds a maximum temperature.

In another embodiment, the present disclosure provides a fluid-cooled ignition coil for a spark ignited internal combustion engine which includes a coil body, a housing having an outer wall spaced apart from the coil body thereby forming a gap around the coil body, wherein the outer wall including a plurality of openings, both in flow communication with the gap, and a pump integrated into the housing adjacent the air inlet to force fluid through the gap to cool the coil body. In one aspect of this embodiment, the fluid-cooled ignition coil includes a temperature sensor supported by the housing that generates a temperature signal indicating a temperature of the coil body. In another aspect of this embodiment, the fluid-cooled ignition coil of claim 18, further comprising a speed sensor supported by the housing to generate a speed signal indicating an operation speed of the fan. In another aspect of this embodiment, the fluid-cooled ignition coil includes a flange coupled to the housing, wherein the flange has a plurality of openings for receiving fasteners to couple the ignition coil to the engine. In another aspect of this embodiment, the second opening of the fluid-cooled ignition coil includes a plurality of vents. In another aspect of this embodiment, the pump of the fluid-cooled ignition coil is molded into the housing. In another aspect of this embodiment, the pump of the fluid-cooled ignition coil is a fan. In another aspect of this embodiment, a first opening and second opening of the fluid-cooled ignition coil are centered on a common axis which is perpendicular to a longitudinal axis of the coil body. In another aspect of this embodiment, the housing of the fluid-cooled ignition coil is formed of molded plastic. In another aspect of this embodiment, a connector of the fluid-cooled ignition coil includes a pair of power conductors coupled to the coil body and the fan, a control conductor coupled to the pump, a temperature conductor coupled to a temperature sensor mounted in the housing to sense coil body temperature, and a speed conductor coupled to a speed sensor mounted in the housing to sense fan speed.

In another embodiment, the present disclosure provides a method of controlling operation of an ignition coil which includes receiving a temperature signal from a temperature sensor, wherein the temperature signal indicating a temperature of the ignition coil, receiving a speed signal from a speed sensor, the speed sensor indicating the operation speed of a pump that forces fluid to cool the ignition coil, generating a control signal that activates a pump based on the temperature signal, and generating a control signal that activates a fault condition based on the operation speed of the pump. In one aspect of this embodiment, the method includes comparing a sensed temperature of the ignition coil to a threshold temperature and activating a pump when the sensed temperature exceeds the threshold temperature. In another aspect of this embodiment, the method includes comparing a sensed temperature of the ignition coil to a threshold temperature and deactivating a pump when the sensed temperature is less than the threshold temperature. In another aspect of this embodiment, the method includes comparing a sensed operation speed of the pump to a set point speed and generating a first fault signal when the pump is activated and the sensed operation speed is less than the set point speed. In another aspect of this embodiment, the method includes generating a second fault signal when the pump is activated, the sensed operation speed is less than the set point speed, and the sensed temperature exceeds a maximum temperature.

BRIEF DESCRIPTION OF THE DRAWINGS

The above-mentioned aspects of the present teachings and the manner of obtaining them will become more apparent and the teachings will be better understood by reference to the following description of the embodiments taken in conjunction with the accompanying drawings, wherein:

FIG. 9 is a summary of an ignition coil control system logic.

DETAILED DESCRIPTION OF THE DISCLOSURE

The embodiments of the present teachings described below are not intended to be exhaustive or to limit the teachings to the precise forms disclosed in the following detailed description. Rather, the embodiments are chosen and described so that others skilled in the art may appreciate and understand the principles and practices of the present teachings.

Figure 1:
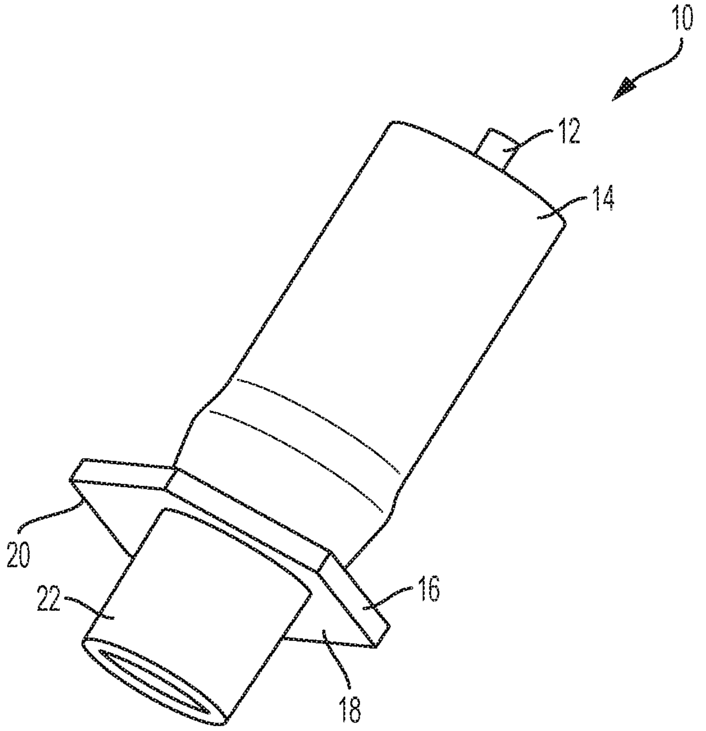
FIG. 1 PRIOR ART
FIG. 1 depicts a typical prior art ignition coil.

As shown generally in FIG. 1, a prior art ignition coil 10 generally includes an input connector 12, a body 14, a mounting flange 16, fastener locations 18, 20, and an output connector 22. As is further explained below with reference to FIG. 2, connector 12 receives low voltage from an electric power source and transforms the low voltage into high output voltage delivered to a spark plug through connector 22 in order to create a spark to ignite fuel in an internal combustion engine. Coil 10 can be mounted to the engine with fasteners placed through fastener locations 18, 20 or mounted external to the engine.

Figure 2:
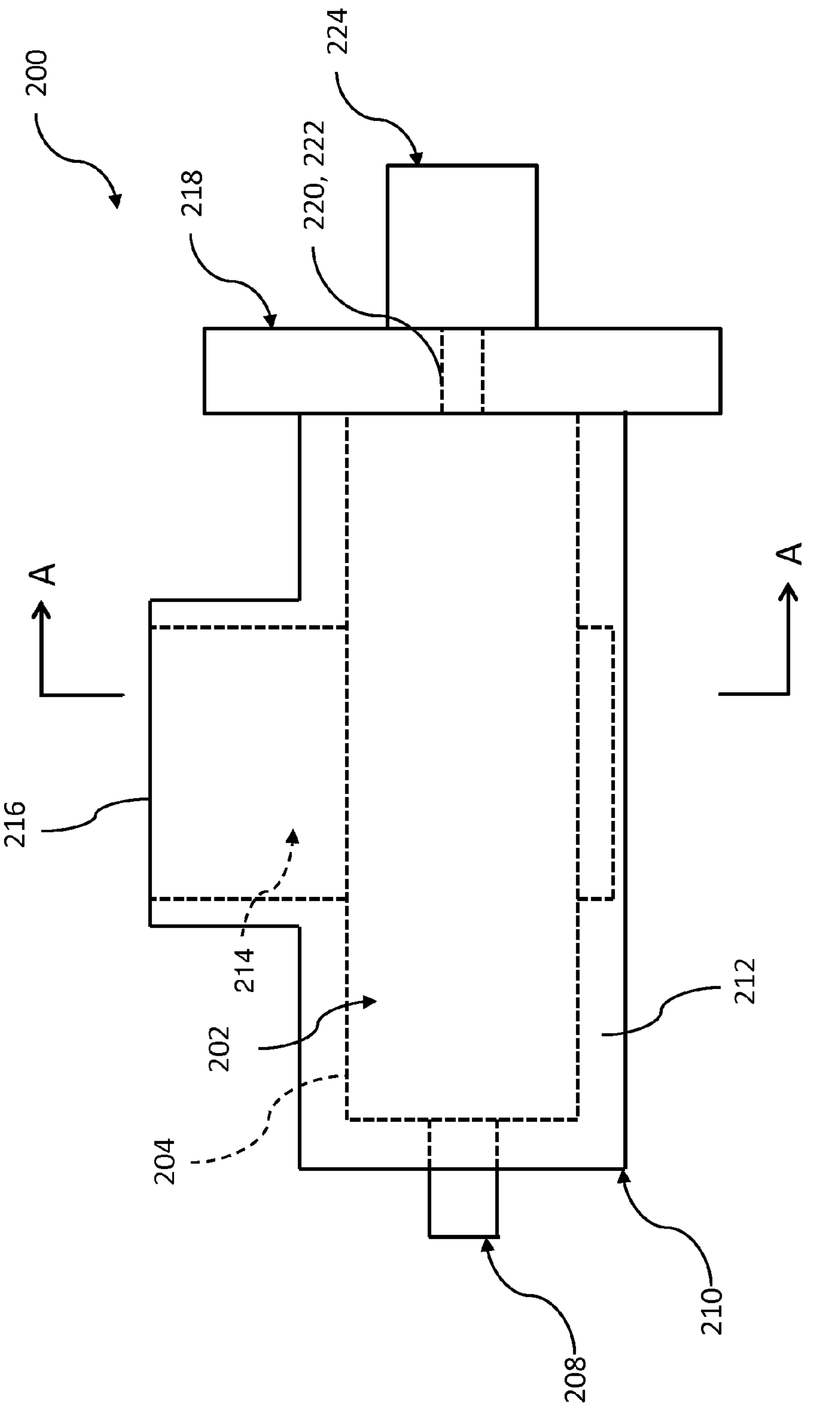
FIG. 2 is a side view of one embodiment of the disclosure.
Figure 3:
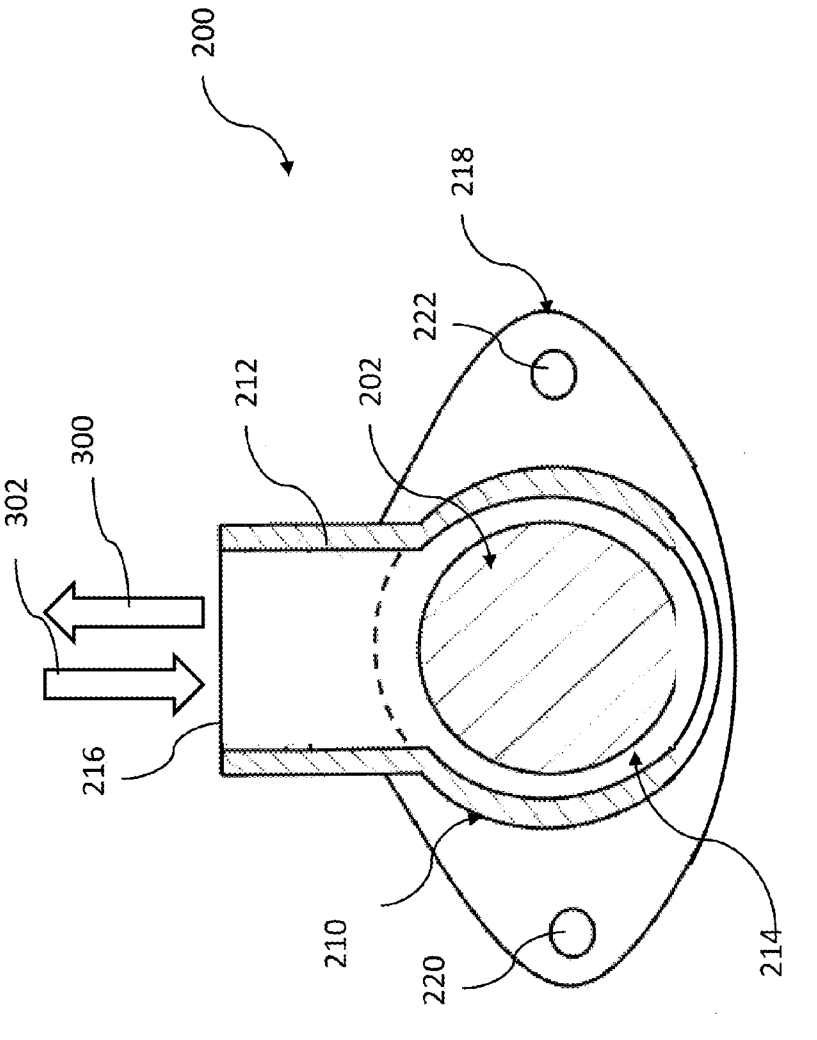
FIG. 3 is a cross-sectional view of the embodiment of FIG. 2 taken along line A-A.

Referring now to FIGS. 2 and 3, one embodiment of the disclosed ignition coil 200 generally includes a coil body 202, having an outer surface 204, and internal windings (not shown), coupled to a connector 208, and a housing 210 surrounding coil body 202. Housing 210 includes an outer wall 212, a portion of which is spaced apart from outer surface 204 of coil body 202 to form a gap 214 between outer surface 204 and outer wall 212. Outer wall 212 includes an opening 216 in flow communication with gap 214. In this embodiment, coil body 202 is cooled by fluid flow through gap 214 across outer surface 204 of coil body 202 through natural convection heat transfer. Ignition coil 200 also includes a flange 218 which has openings 220, 222 for the purpose of receiving fasteners to couple ignition coil 200 to the engine or other location. Housing 210 could be plastic, aluminum, steel, or a composite material. Ignition coil 200 also includes an output connector 224 which connects to the spark plug (either directly or through a high voltage extension). While coil 200 and other embodiments described below are depicted as flange mount coils, it should be understood that the principles of the present disclosure are equally applicable to other coil configurations such as bracket mount coils.

As shown best in FIG. 3 and indicated by arrows 300, 302, fluid enters and exits through opening 216 and passes through and around coil body 202 through gap 214 formed between coil body 202 and outer wall 212 of coil housing 210.

Figure 4:
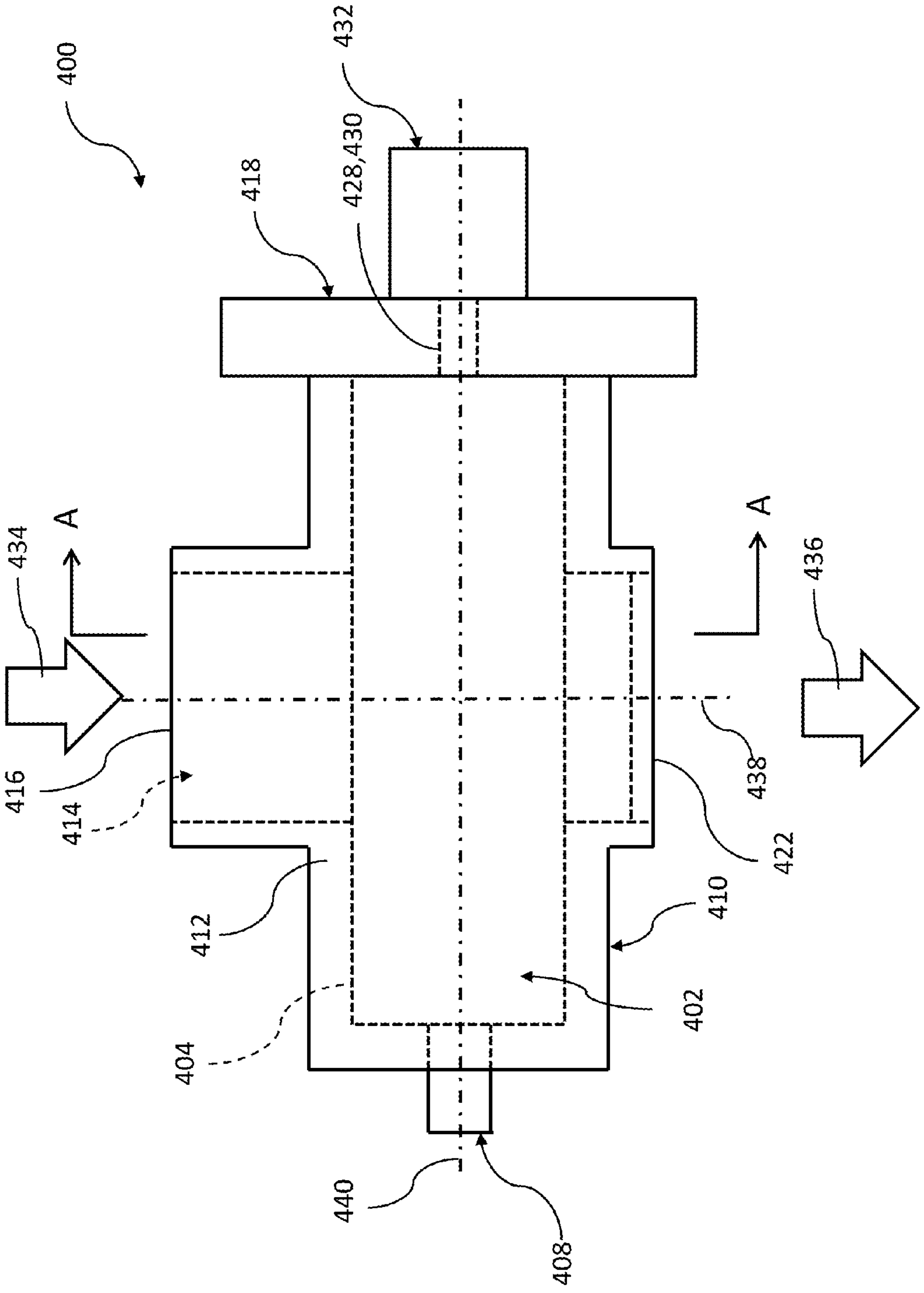
FIG. 4 is a side view of another embodiment of the disclosure.
Figure 5:
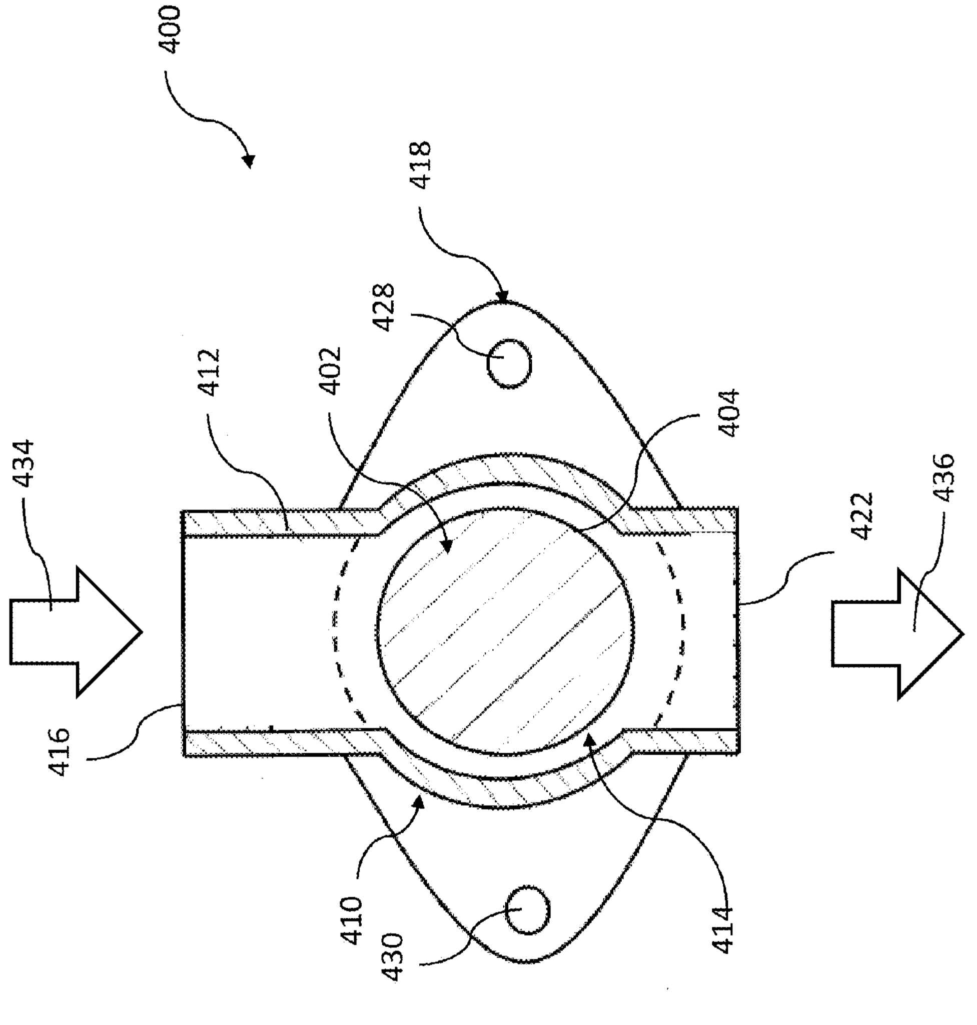
FIG. 5 is a cross-sectional view of the embodiment of FIG. 4 taken along line A-A.

FIGS. 4 and 5 depict another embodiment of an ignition coil according to the disclosure. Ignition coil 400 generally includes, a coil body 402, having an outer surface 404, and internal windings (not shown), coupled to a connector 408, and a housing 410 surrounding coil body 402. Housing 410 includes an outer wall 412 spaced apart from outer surface 404 of coil body 402 which forms a gap 414 between outer surface 404 and outer wall 412. Outer wall 412 includes a first opening 416 in flow communication with gap 414 and a second opening 422 in fluid communication with gap 414. In this embodiment, coil body 402 is cooled through fluid flow through gap 414 across outer surface 404 of coil body 402. Fluid, as indicated by arrows 434, 436, may enter opening 416 and exit through opening 422. In an exemplary embodiment, first opening 416 and second opening 422 are centered on a common axis 438 which is perpendicular to a longitudinal axis 440 of coil body 402. It should be understood that axis 438 (and therefore openings 416, 422) may be located at any desired location along the length of coil body 402, and in one embodiment is located in alignment with the portion of the coil windings that generates the most heat. In this embodiment, coil body 402 is cooled by fluid flow through gap 414 across the outer surface of coil body 404 either through natural convection heat transfer or by forcing fluid flow through gap 414 through the use of a pump (not shown) mounted separately from coil 400. Ignition coil 400 also includes a flange 418 coupled to housing 410 which has openings 428, 430 for the purpose of receiving fasteners to couple ignition coil 400 to the engine or other location. Ignition coil 400 also includes an output connector 432 which connects to the spark plug (either directly or through a high voltage extension).

As best shown in FIG. 5, fluid (indicated by arrow 434) enters through opening 416, passes around coil body 402, through gap 414 formed between outer surface 404 and outer wall 412, and exits through opening 422 as indicated by arrow 436.

Figure 6:
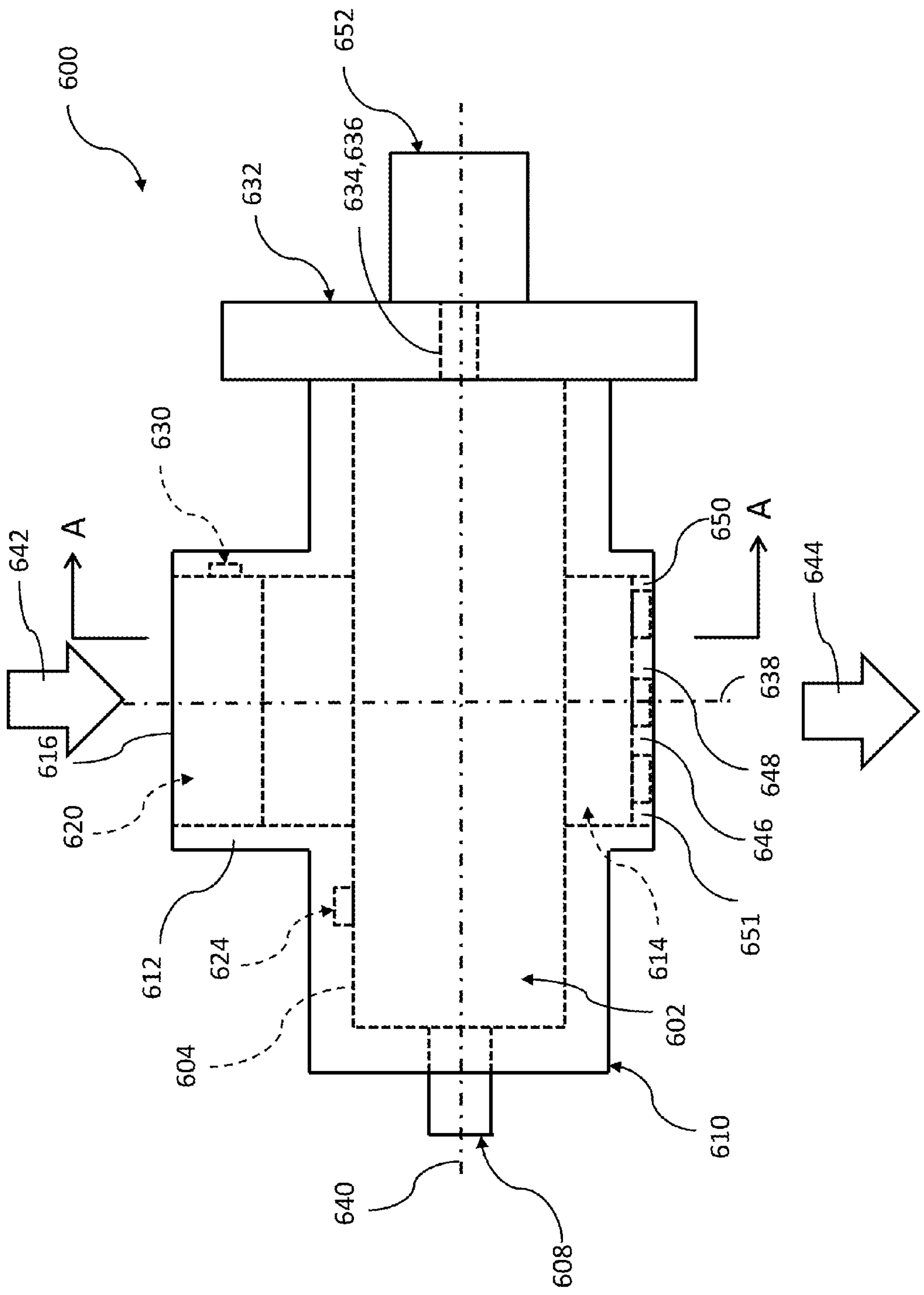
FIG. 6 is a side view of another embodiment of the disclosure.
Figure 7:
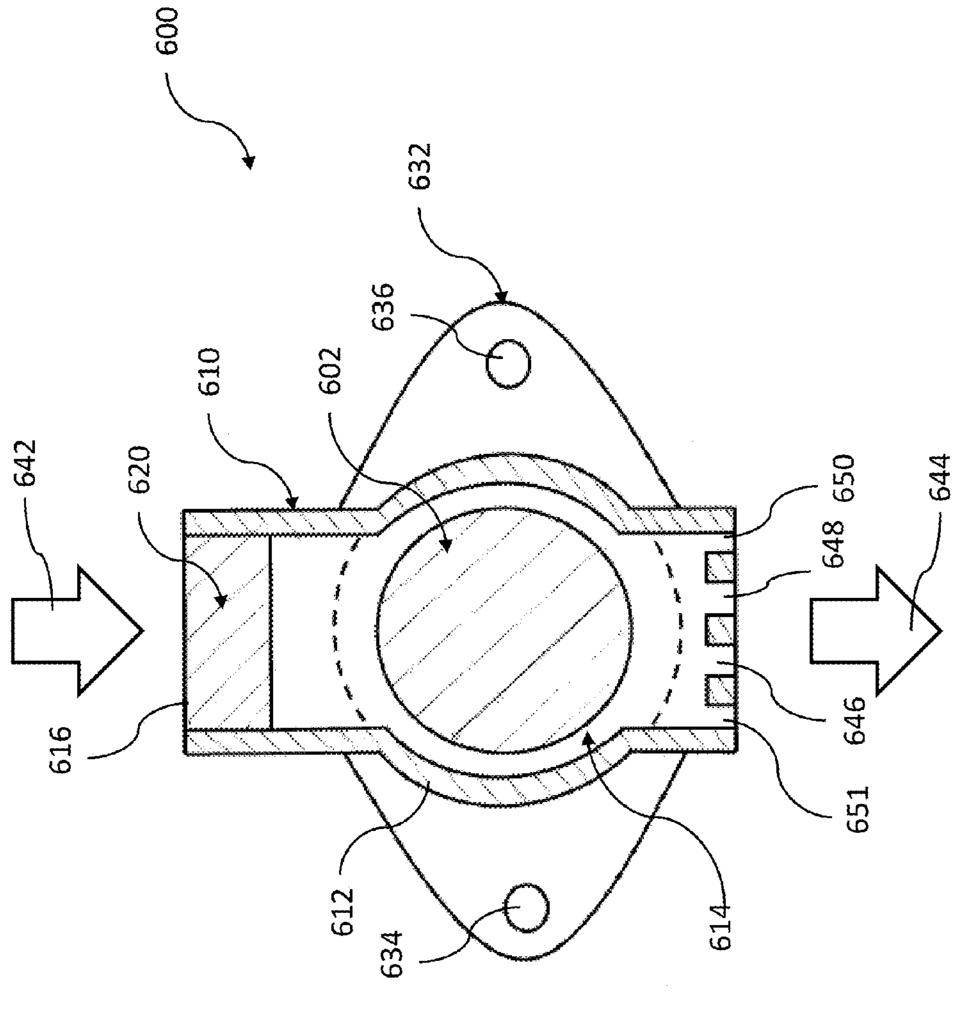
FIG. 7 is a cross-sectional view of the embodiment of FIG. 6 taken along line A-A.

FIGS. 6 and 7 depict yet another embodiment of an ignition coil according to the disclosure. Ignition coil 600 generally includes, a coil body 602, having an outer surface 604, and internal windings (not shown), coupled to a connector 608, and a housing 610 surrounding coil body 602. Housing 610 includes an outer wall 612 spaced apart from outer surface 604 of coil body 602 which forms a gap 614 between outer surface 604 and outer wall 612. Outer wall 612 includes a first inlet opening 616 in flow communication with gap 614 and a plurality of outlet openings 646, 648, 650, 651 in fluid communication with gap 614. In this embodiment, coil body 602 is cooled through fluid flow through gap 614 across outer surface 604 of coil body 602. Fluid, as indicated by arrows 642, 644, enters through opening 616 and exits through openings 646, 648, 650, 651. First opening 616 is centered on a common axis 638 which is perpendicular to a longitudinal axis 640 of coil body 602. As indicated above with reference to FIG. 4, axis 638 may be located in alignment with the portion of the coil windings that generates the most heat. In any of the disclosed embodiments, fluid may be air, engine coolant, fuel, engine oil, or other suitable fluid.

In this embodiment, coil body 602 is cooled by forcing fluid through gap 614 across the outer surface of coil body 604 using a pump 620. Pump 620 is supported by housing 610. Pump 620 may be a fan which forces air around coil body 602 but also may be a pump or turbine. This embodiment further employs a temperature sensor 624 to generate a temperature signal indicating the temperature of coil body 602. Signals from sensor 624 may be routed through connector 608 or through a different connector to separate high voltage signals from low voltage signals. Temperature sensor 624 may be a thermocouple, a resistive temperature device, an infrared device, a bi-metallic device, a silicon diode device, or other suitable sensor. While temperature sensor 624 is shown in contact with coil body 602, temperature sensor 624 may be mounted in other locations to detect temperatures that indicated the temperature of coil body 602. Additionally in this embodiment, a speed sensor 630 monitors the operation speed of pump 620. Speed sensor 630 may be of a type that is variable reluctance based, Hall Effect based, Eddy current based, mechanical, optical, laser, or other suitable type. Ignition coil 600 also includes a flange 632 which has openings 634, 636 for the purpose of receiving fasteners to couple ignition coil 600 to the engine or other location. Ignition coil 600 also includes an output connector 652 which connects to the spark plug.

As best shown in FIG. 7 pump 620 forces fluid, as indicated by arrows 642, 644, through opening 616, around coil body 602, through gap 614, and out openings 646, 648, 650, 651.

Figure 8:
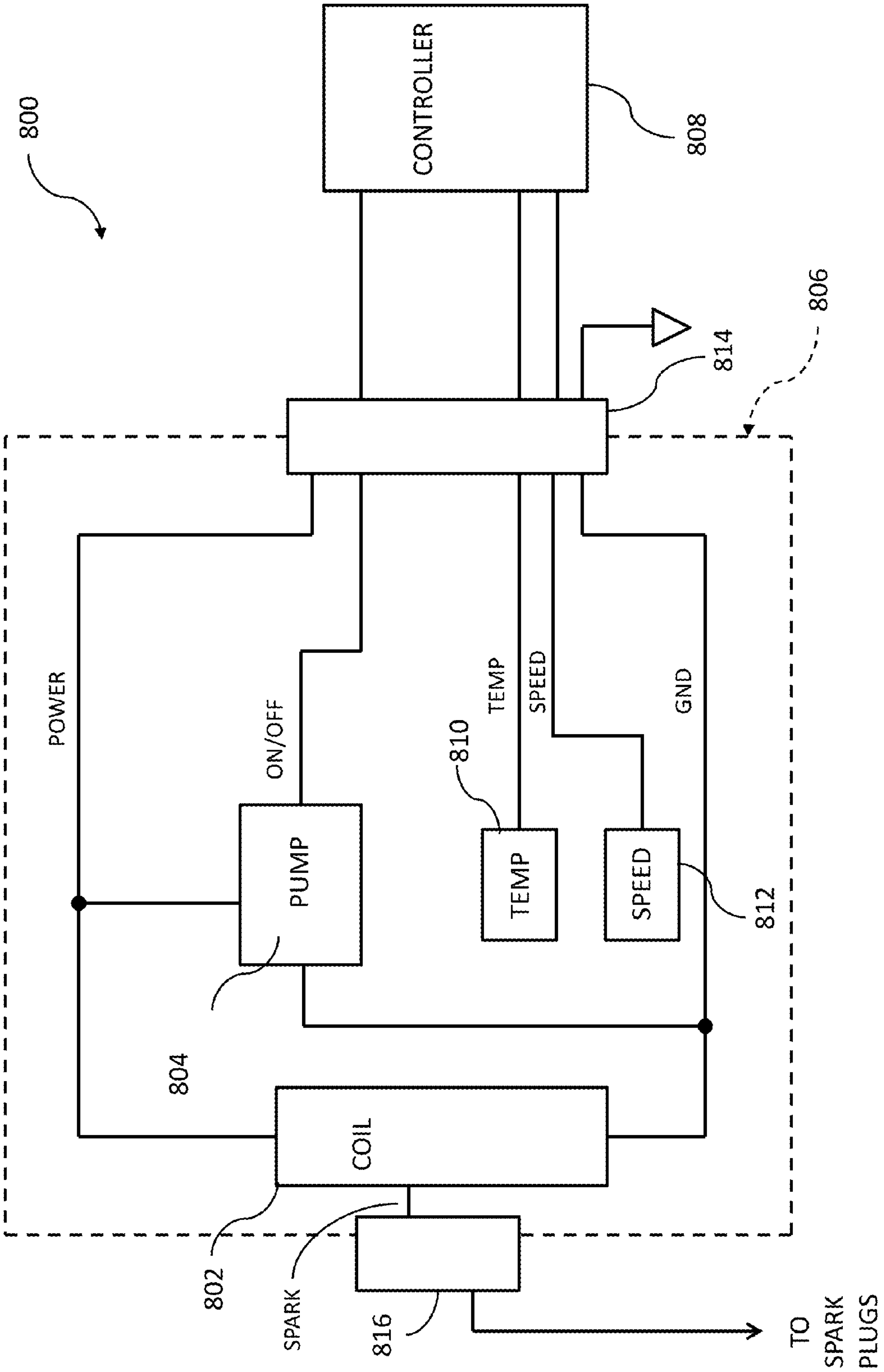
FIG. 8 is a schematic of an ignition coil control system.

FIG. 8 depicts a schematic of an ignition coil control system 800. System 800 generally includes an ignition coil 802, a pump 804, a power source (not shown), an ignition controller 808, a temperature sensor 810, and a pump speed sensor 812. Ignition coil 802, pump 804, temperature sensor 810, pump speed sensor 812, an electrical connector 814, and a spark plug connector 816 are all part of a coil assembly 806. As indicated above, coil assembly 806 may include two or more connectors (instead of only connector 814) to separate high voltage signals from low voltage signals. System 800 uses connector 814 to connect the sensed signals from temperature sensor 810 and pump speed sensor 812 to controller 808 and power to pump 804. System 800 uses connector 814 to connect signals and power from controller 818 to ignition coil 802, and distributes electric energy to the spark plug via connector 816.

Referring now to FIG. 9, control logic 900 for a disclosed ignition coil control system such as system 800 of FIG. 8 is shown. Control logic 900 generally includes an electric power source status column 902, a sensed coil temperature column 904, a sensed pump speed column 906, a pump operation status column 908, and an action column 910. As indicated by the first line of logic 900, when the coil temperature signal received is below a threshold temperature, the pump is off and not pumping fluid. The second line shows that when the coil temperature reaches or exceeds a threshold temperature, the computer controller activates the pump to pump fluid. As indicated by the third line, when the coil temperature reaches or exceeds a threshold temperature but is less than a maximum temperature, and the pump speed is less than a threshold speed, the computer controller records a first level fault condition. Finally, the fourth line shows that when the coil temperature reaches or exceeds a threshold temperature and is equal to or greater than a maximum temperature, at any pump speed, controller 808 records a second level fault condition. Corrective actions can be assigned to the fault conditions based on the severity of the fault to the operation of the engine and/or process. As an example, a first level fault may only require operator awareness, inspection and monitoring. A second level fault may require the operator to shut the engine down and investigate the condition of the cooling pump and cooling system. The actual corrective actions can be tailored within the controller logic to the actual application based on the severity a fault has to the engine and/or process.

While exemplary embodiments incorporating the principles of the present teachings have been disclosed hereinabove, the present teachings are not limited to the disclosed embodiments. Instead, this application is intended to cover any variations, uses, or adaptations of the disclosed general principles. Further, this application is intended to cover such departures from the present disclosure as come within known or customary practice in the art to which this application pertains and which fall within the limits of the appended claims.

What is claimed is:

1. An ignition coil for a spark ignited internal combustion engine, comprising:

a coil body having a first end, a second end, an outer surface extending around the coil body and internal windings; and a housing surrounding the coil body, the housing having an outer wall spaced apart from the outer surface of the coil body thereby forming a gap between the outer surface of the coil body and the outer wall, the gap being positioned between the first end and the second end of the coil body, and the outer wall including an opening in flow communication with the gap.

2. The ignition coil of claim 1, further comprising a temperature sensor supported by the housing and coupled to a connector, the temperature sensor generating a temperature signal indicating a temperature of the coil body.

3. The ignition coil of claim 1, further comprising a speed sensor coupled to a connector, the speed sensor generating a speed signal indicating speed of operation of a pump.

4. The ignition coil of claim 1, wherein the outer wall includes a plurality of openings.

5. The ignition coil of claim 4, wherein a first opening and second opening are centered on a common axis which is perpendicular to a longitudinal axis of the coil body.

6. The ignition coil of claim 1, further comprising a fluid pump which, in operation, forces fluid from outside the housing into an opening, through the gap and out another opening to cool the coil body.

7. The ignition coil of claim 6, wherein the pump is supported by the housing.

8. The ignition coil of claim 6, wherein the pump is a fan having a plurality of rotatable blades which, in operation, force air from outside the housing into an opening, through the gap and out another opening to cool the coil body.

9. The ignition coil of claim 8, wherein the fan is molded into the housing.

10. The ignition coil of claim 1, further comprising a flange coupled to the housing, the flange having a plurality of openings for receiving fasteners to couple the ignition coil to the engine.

11. The ignition coil of claim 1, wherein the housing is formed of molded plastic.

12. A method of cooling a coil body of an ignition coil for a spark ignited internal combustion engine, comprising:

providing a housing having an outer wall spaced apart from the coil body to form a gap between the coil body and the outer wall, the outer wall having a plurality of openings in flow communication with the gap;

providing a pump;

comparing a sensed temperature of the coil body to a threshold temperature; and activating the pump when the sensed temperature is greater than the threshold temperature to force fluid from outside the housing into a first opening, through the gap, and out a second opening to cool the coil body.

13. The method of claim 12, further comprising:

deactivating the pump when the sensed temperature is less than the threshold temperature.

14. The method of claim 12, wherein the pump is supported by a housing.

15. The method of claim 12, further comprising:

comparing a sensed operation speed of the pump to a set point speed; and generating a first fault signal when the pump is activated and the sensed operation speed is less than the set point speed.

16. The method of claim 15, further comprising:

generating a second fault signal when the pump is activated, the sensed operation speed is less than the set point, and the sensed temperature exceeds a maximum temperature.

17. A fluid-cooled ignition coil for a spark ignited internal combustion engine, comprising:

a coil body;

a housing having an outer wall spaced apart from the coil body thereby forming a gap around the coil body, the outer wall including a plurality of openings in flow communication with the gap; and a pump integrated into the housing adjacent one of the plurality of openings to force fluid through the gap to cool the coil body.

18. The fluid-cooled ignition coil of claim 17, further comprising a temperature sensor supported by the housing to generate a temperature signal indicating a temperature of the coil body.

19. The fluid-cooled ignition coil of claim 17, further comprising a speed sensor supported by the housing to generate a speed signal indicating an operation speed of the pump.

20. The fluid-cooled ignition coil of claim 17, further comprising a flange coupled to the housing, the flange having a plurality of openings for receiving fasteners to couple the ignition coil to the engine.

21. The fluid-cooled ignition coil of claim 17, further comprising a second opening including a plurality of vents to permit the fluid forced through the gap to exit the gap.

22. The fluid-cooled ignition coil of claim 17, wherein the pump is molded into the housing.

23. The fluid-cooled ignition coil of claim 17, wherein the pump is a fan.

24. The fluid-cooled ignition coil of claim 17, wherein the one opening and another opening of the plurality of openings are centered on a common axis which is perpendicular to a longitudinal axis of the coil body.

25. The fluid-cooled ignition coil of claim 17, wherein the housing is formed of molded plastic.

26. The fluid-cooled ignition coil of claim 17, further comprising a connector including a pair of power conductors coupled to the coil body and the pump, a control conductor coupled to the pump, a temperature conductor coupled to a temperature sensor mounted in the housing to sense coil body temperature, and a speed conductor coupled to a speed sensor mounted in the housing to sense pump speed.

* * * * *